(12) United States Patent
Kawazu

(10) Patent No.: US 9,922,925 B2
(45) Date of Patent: Mar. 20, 2018

(54) ELECTRONIC COMPONENT HOUSING PACKAGE, AND ELECTRONIC DEVICE COMPRISING SAME

(71) Applicant: KYOCERA Corporation, Kyoto-shi, Kyoto (JP)

(72) Inventor: Yoshiki Kawazu, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 15/322,202

(22) PCT Filed: Jul. 27, 2015

(86) PCT No.: PCT/JP2015/071228
§ 371 (c)(1),
(2) Date: Dec. 27, 2016

(87) PCT Pub. No.: WO2016/017574
PCT Pub. Date: Feb. 4, 2016

(65) Prior Publication Data
US 2017/0133315 A1      May 11, 2017

(30) Foreign Application Priority Data

Jul. 30, 2014   (JP) .................................. 2014-154472

(51) Int. Cl.
*H01L 23/00*      (2006.01)
*H01L 23/498*     (2006.01)
*H01L 23/66*      (2006.01)
*H01L 23/13*      (2006.01)
*H01L 21/48*      (2006.01)

(52) U.S. Cl.
CPC ...... *H01L 23/49861* (2013.01); *H01L 21/481* (2013.01); *H01L 21/486* (2013.01); *H01L 21/4857* (2013.01); *H01L 21/4867* (2013.01); *H01L 23/13* (2013.01);
(Continued)

(58) Field of Classification Search
CPC ................................................ H01L 24/19861
See application file for complete search history.

(56) References Cited

FOREIGN PATENT DOCUMENTS

| JP | 11-214556 A | 8/1999 |
|----|-------------|--------|
| JP | 2003-151856 A | 5/2003 |

(Continued)

OTHER PUBLICATIONS

International Search Report, PCT/JP2015/071228, dated Sep. 29, 2015, 2 pgs.

*Primary Examiner* — William Harriston
(74) *Attorney, Agent, or Firm* — Volpe and Koenig, P.C.

(57) ABSTRACT

An electronic component housing package includes an insulating base including an upper surface, the insulating base including a first cut-out portion and a second cut-out portion which are provided on a lower surface of the insulating base. The first cut-out portion is formed by cutting into a lower part of a side surface of the insulating base and cutting out from the lower part to a lower surface of the insulating base. On the first cut-out portion are formed wiring conductors which are led from the lower surface of the insulating base and come to the upper surface of the insulating base through the insulating base via an inside wall surface of the first cut-out portion. The second cut-out portion is provided between the wiring conductors and extends from the inside wall surface of the first cut-out portion to the lower surface of the insulating base.

4 Claims, 6 Drawing Sheets

(52) U.S. Cl.
CPC ........ *H01L 23/49838* (2013.01); *H01L 23/66* (2013.01); *H01L 2223/6611* (2013.01)

(56) References Cited

FOREIGN PATENT DOCUMENTS

| | | |
|---|---|---|
| JP | 2009-177041 A | 8/2009 |
| JP | 2010-028800 A | 2/2010 |
| JP | 2012-174713 A | 9/2012 |

ELECTRONIC COMPONENT HOUSING PACKAGE, AND ELECTRONIC DEVICE COMPRISING SAME

TECHNICAL FIELD

The present invention relates to an electronic component housing package for housing an electronic component, and an electronic device. More specifically, the invention relates to a high frequency electronic component housing package provided with an external connection conductor on a side surface, and an electronic device.

BACKGROUND ART

Examples of the electronic component housing package include an electronic component housing package disclosed in Patent Literature 1. This electronic component housing package is provided with an external connection conductor on a side surface of an insulating base.

An electronic component housing package 100 shown in FIG. 6 has a cut-out portion 105 formed by cutting out a part of a side surface 104 from the side surface 104 to a lower surface 103. Moreover, wiring conductors 107 which are led from the lower surface 103 to an upper surface 102 of an insulating base 101 are formed. The wiring conductors 107 are led from the lower surface 103 to the upper surface 102 via the inside wall surface of a concave portion 106 provided in the cut-out portion 105.

Since the wiring conductors 107 are disposed on the inner side of the cut-out portion 105, joining with an external circuit board can be performed on the inner side of the outer perimeter of the insulating base 101. Thereby, a plurality of electronic component housing packages 100 can be mounted in such a manner as to be arranged without the provision of a gap on the external circuit board.

Moreover, Patent Literature 2 shows that when a plurality of line conductors are arranged, a groove is disposed between the line conductors in order to reduce the deterioration in high frequency characteristic due to electrical interference between the line conductors.

CITATION LIST

Patent Literature

Patent Literature 1: Japanese Unexamined Patent Publication JP-A 2012-174713
Patent Literature 2: Japanese Unexamined Patent Publication JP-A 11-214556 (1999)

SUMMARY OF INVENTION

Technical Problem

However, when a plurality of wiring conductors 107 are disposed to transmit a high frequency signal, there is a problem that it is impossible to dispose the wiring conductors 107 at not less than a certain wiring density if the characteristic impedance of the wiring conductors 107 is intended to be set to a predetermined value. For this reason, there is a problem that the electronic component housing package 100 is increased in size.

The invention is made in view of the above-mentioned problems, and an object thereof is to provide an electronic component housing package and an electronic device comprising the same which are reduced in size.

Solution to Problem

An electronic component housing package according to an embodiment of the invention includes an insulating base comprising an upper surface including an electronic component mounting area, the insulating base comprising a first cut-out portion which is formed by cutting into a lower part of a side surface of the insulating base and cutting out from the lower part of the side surface to a lower surface of the insulating base and extends from the lower part of the side surface to the lower surface; a plurality of wiring conductors which are led from the lower surface of the insulating base and come to the upper surface of the insulating base through the insulating base via an inside wall surface of the first cut-out portion; and a second cut-out portion which is provided between the plurality of wiring conductors and extends from the inside wall surface of the first cut-out portion to the lower surface of the insulating base.

In the electronic component housing package, positions of the plurality of wiring conductors disposed on the inside wall surface of the first cut-out portion may be on different faces in a cut-out depth direction of the first cut-out portion due to different cut-out depths of the first cut-out portion from the side surface of the insulating base.

In the electronic component housing package, the first cut-out portion may comprise a first portion which is cut out from the side surface of the insulating base and a second portion which is formed by further cutting out an inner surface central part of an inside wall of the first portion, the plurality of wiring conductors may be disposed on an inside wall surface of the second portion, an outermost wiring conductor thereof may be disposed from an inner surface of the second portion to a boundary between the first portion and the second portion, and the inner surface may be disposed in a deeper position in a depth direction in which the second portion is cut out, than a central wiring conductor of the plurality of wiring conductors.

Moreover, in the electronic component housing package, the plurality of wiring conductors may constitute a high frequency differential signal line, and a wiring conductor of the plurality of wiring conductors which is disposed on an outermost side may be a grounding conductor.

Moreover, an electronic device according to an embodiment of the invention comprises the electronic component housing package mentioned above; and an electronic component which is mounted on the electronic component mounting area, the electronic component being electrically connected to the plurality of wiring conductors.

Advantageous Effects of Invention

According to the electronic component housing package of the embodiment of the invention, since there are provided the plurality of wiring conductors which are led from the lower surface of the insulating base and come to the upper surface of the insulating base through the insulating base via the inside wall surface of the first cut-out portion and the second cut-out portion which provided between the plurality of wiring conductors and extends from the inside wall surface of the first cut-out portion to the lower surface of the insulating base, the wiring conductors can be densely disposed, so that the electronic component housing package can be reduced in size.

Moreover, in the electronic component housing package, if the positions of the plurality of wiring conductors disposed on the inside wall surface are on different faces in the cut-out depth direction of the first cut-out portion due to different cut-out depths of the first cut-out portion from the side surface of the insulating base, the capacitive coupling between the wiring conductors can be reduced, so that the wiring conductors can be further densely disposed.

Moreover, in the electronic component housing package, if the first cut-out portion comprises the first portion which is cut out from the side surface of the insulating base and the second portion which is formed by further cutting out the inner surface central part of the inside wall of the first portion, the plurality of wiring conductors are disposed on the inside wall surface of the second portion, the outermost wiring conductor thereof is disposed from the inner surface of the second portion to the boundary between the first portion and the second portion, and the inner surface of the second portion is disposed in the deeper position in the depth direction in which the second portion is cut out, than the central wiring conductor of the plurality of wiring conductors, the capacitive coupling between the central wiring conductor and the outermost wiring conductor can be reduced, so that the wiring conductors can be densely disposed.

Moreover, in the electronic component housing package, when the plurality of wiring conductors constitute a high frequency differential signal line and the wiring conductor of the plurality of wiring conductors which is disposed on the outermost side is a grounding conductor, the high frequency differential signal line can be densely disposed, so that a small and high-performance electronic component housing package can be obtained.

Moreover, according to the electronic device of the embodiment of the invention, it is possible to obtain an electronic device which is reduced in size and excellent in high frequency characteristic.

DESCRIPTION OF EMBODIMENTS

Hereinafter, an electronic component housing package (hereinafter, sometimes referred to merely as package) and an electronic device including the same according to an embodiment of the invention will be described with reference to the drawings.

Figure 1:
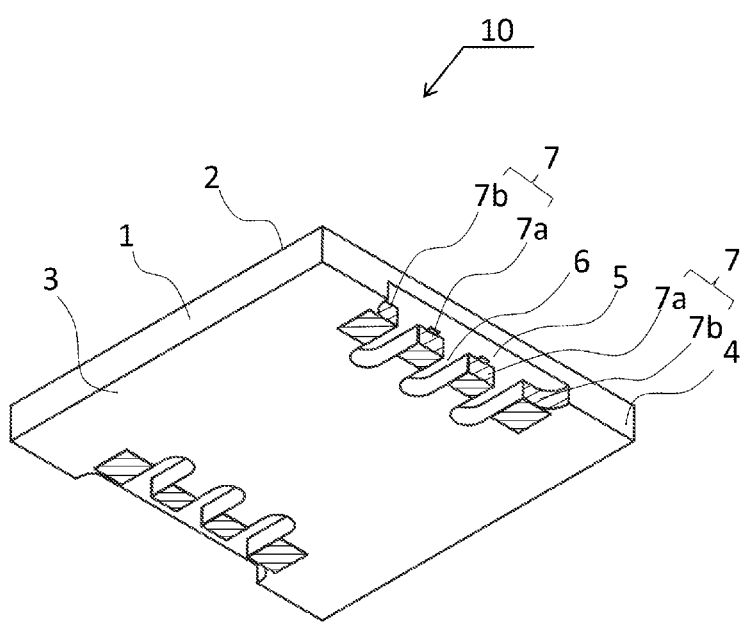
FIG. 1 is a perspective view of an electronic component housing package according to one embodiment of the invention viewed obliquely from below.
Figure 2:
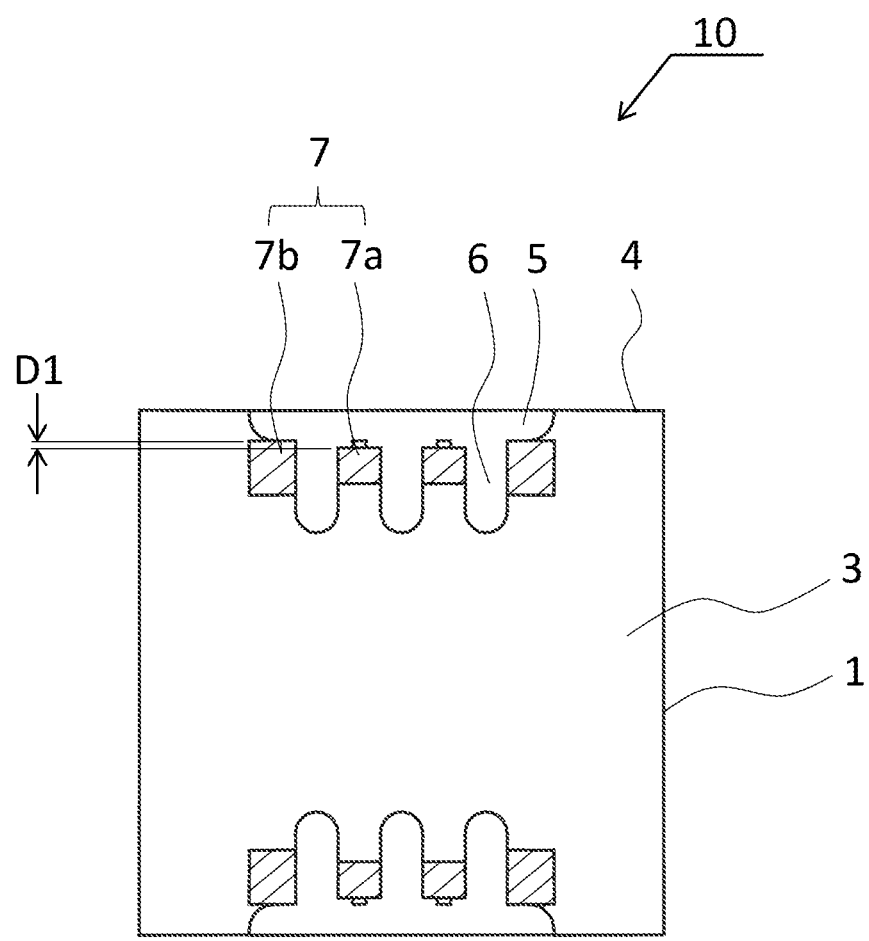
FIG. 2 is a bottom view of the electronic component housing package shown in FIG. 1.
Figure 5:
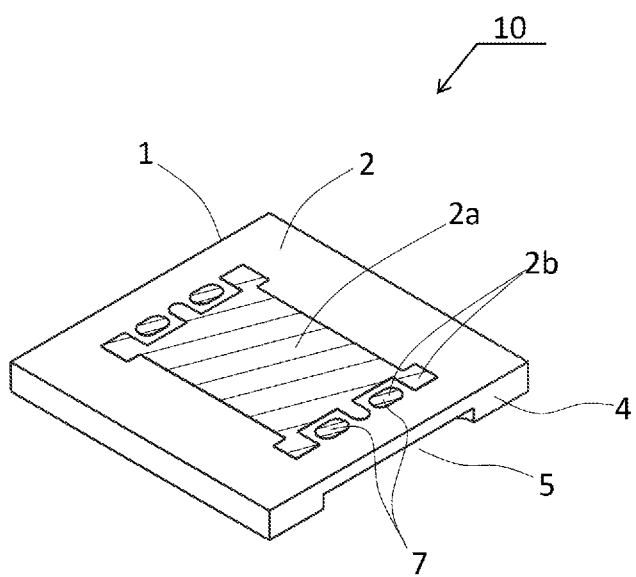
FIG. 5 is a perspective view of the electronic component housing package according to the one embodiment of the invention viewed obliquely from above.
Figure 6:
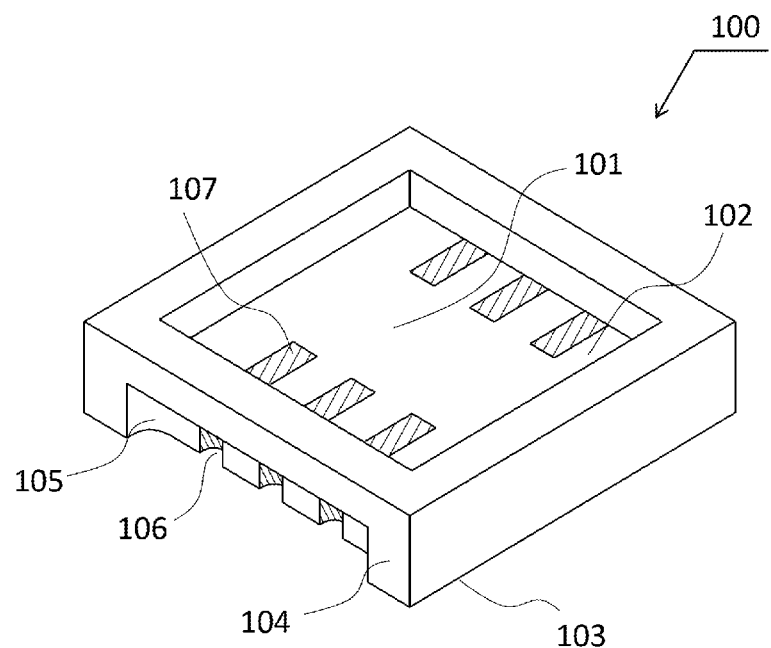
FIG. 6 is a perspective view showing an example of the conventional electronic component housing package.

FIG. 1 is a perspective view of an electronic component housing package 10 viewed obliquely from below. FIG. 2 is a bottom view of the electronic component housing package 10 shown in FIG. 1. Moreover, FIG. 5 is a perspective view of this electronic component housing package 10 viewed obliquely from above. In these figures, for easy distinction, wiring conductors 7 and other metalized layer formed parts are hatched. This hatching does not indicate cross sections. Moreover, in these figures, the same parts are denoted by the same reference numerals. To avoid complexity of the figures, when two or more same parts are present in one figure, there are cases where a reference numeral is assigned to a representative one and assignment of the same reference numeral to all the parts is omitted.

The electronic component housing package 10 includes, for example as shown in FIG. 1, an insulating base 1 which is quadrilateral in external shape in a plan view. The insulating base 1, for example, has the shape of a square with sides of 2 mm to 20 mm and has a plate-like shape with a thickness of 0.2 mm to 2 mm. Besides this, it may have various shapes and sizes such as a rectangular shape or a polygonal shape as required.

The insulating base 1 includes a first cut-out portion 5 which is formed in a lower part of a side surface 4. In the embodiment shown in FIG. 1, the first cut-out portion 5 is provided by cutting out a lower half of the side surface 4. The first cut-out portion 5 is cut out up to a lower surface 3 of the insulating base 1, and an opening is formed on the side surface 4 and the lower surface 3.

The first cut-out portion 5 may be provided not only on the side surface 4 but also on another side surface, for example as shown in FIG. 1, the side surface on the opposite side of the side surface 4. Further, the first cut-out portion 5 may be provided on all the side surfaces. Moreover, the first cut-out portion 5 may be provided by cutting out by an amount thinner than the lower half of the side surface 4 in the direction of the length of the insulating base 1. Thereby, the flexural strength of the part of the insulating base 1 where the first cut-out portion 5 is formed can be improved. As a result, a crack or a fracture due to stress or warpage caused in the insulating base 1 can be made difficult to occur.

The wiring conductors 7 are led from the lower surface 3 and come to an upper surface 2 of the insulating base 1 through the inside of the insulating base 1 via the inner side inside wall surface of the first cut-out portion 5. The wiring conductor 7 has the function of establishing high frequency signal continuity between the lower surface 3 and the upper surface 2. The part of the wiring conductor 7 disposed on the lower surface 3 and the inside wall surface of the first cut-out portion 5 are connected through the electrodes of an external wiring board and a gold (Au)-tin (Sn) solder, a silver (Ag)-tin (Sn) solder, a gold (Au)-germanium (Ge) solder or the like. The plurality of wiring conductors 7 are disposed in parallel. In the following description, when these wiring conductors 7 are distinguished from each other, branch numbers such as wiring conductors 7a and 7b are assigned.

Moreover, a second cut-out portion 6 is provided between the plurality of wiring conductors 7. By the provision of the second cut-out portion 6, the capacitive coupling between the adjoining wiring conductors 7 can be reduced, so that the wiring conductors 7 can be densely disposed. In addition, the area where the plurality of wiring conductors 7 are disposed can be reduced, so that the package can be reduced in size. Further, since no stress is caused between the adjoining wiring conductors 7 in the second cut-out portion 6 formed by cutting out the insulating base 1, the occurrence of a crack or a fracture caused in the insulating base 1 around the wiring conductors 7 can be suppressed.

Moreover, it can be made difficult that the joining material such as a solder which electrically connects the electronic component housing package 10 to the external wiring board, forms abridge between the adjoining wiring conductors 7. As a result, the adjoining wiring conductors 7 can be more densely disposed.

The second cut-out portion 6 is provided between the inner surface of the first cut-out portion 5 and the lower surface 3, and has an opening on the first cut-out portion 5 and the lower surface 3. It is desirable that the second cut-out portion 6 be provided deeply to the inner side of the end of the wiring conductor 7 on the lower surface 3. The second cut-out portion 6 has a width of, for example, 0.25 mm and extends from the edge of the wiring conductor 7 to the edge of the adjoining wiring conductor 7. In a case where the second cut-out portion 6 is not provided, when the dielectric constant of the insulating base 1 is 9.6 F/m, it is necessary to provide an interval of 2.375 mm between the wiring conductors 7. The dimension example is based on a case where a high frequency signal in the neighborhood of 28 GHz is used.

The depth of the cut-out part from the side surface 4 of the first cut-out portion 5 where the wiring conductors 7 are formed may be varied so that the wiring conductors 7 are formed on this surface. For example, the wiring conductor 7a is disposed on the inner side inside wall surface of the first cut-out portion 5. The wiring conductor 7a is not level with the wiring conductor 7b, and the wiring conductor 7a and the wiring conductor 7b are not disposed on the same plane. Thereby, the capacitive coupling caused between the wiring conductor 7a and the wiring conductor 7b can be reduced. Moreover, thereby, the wiring conductors 7 can be further densely disposed. Further, it can be made difficult that a solder bridge is formed between the wiring conductor 7a and the wiring conductor 7b.

As is apparent from the example shown in FIG. 2, the central wiring conductor 7a and the outermost wiring conductor 7b are different by D1 in the depth of the cut-out part of the first cut-out portion 5 from the side surface 4. The distance from the side surface 4 to the central wiring conductor 7a is longer by D1 than that to the outermost wiring conductor 7b. The central wiring conductor 7a and the outermost wiring conductor 7b are disposed on planes which are not level with each other.

From the viewpoint of reducing the capacitive coupling, a larger distance D1 is more desirable. However, if the distance D1 is too large, although the capacitive coupling between the wiring conductor 7a and the wiring conductor 7b is small, the small capacitive coupling cannot be sufficiently adjusted by the conductor spacing between the wiring conductor 7a and the wiring conductor 7b, so that there is a possibility that the function as a high frequency line cannot be delivered. For example, if the high frequency impedance determined by the disposition relation between the wiring conductor 7a and the wiring conductor 7b exceeds a predetermined range, the transmission characteristic of the high frequency line formed by the wiring conductor 7a formed on the inner surface of the first cut-out portion 5 and the wiring conductor 7b functioning as a grounding conductor is deteriorated. Therefore, the distance D1 is set, for example, to 0.01 mm to 0.1 mm. Specifically, in an example of the present embodiment, the distance D1 is 0.05 mm.

Figure 3:
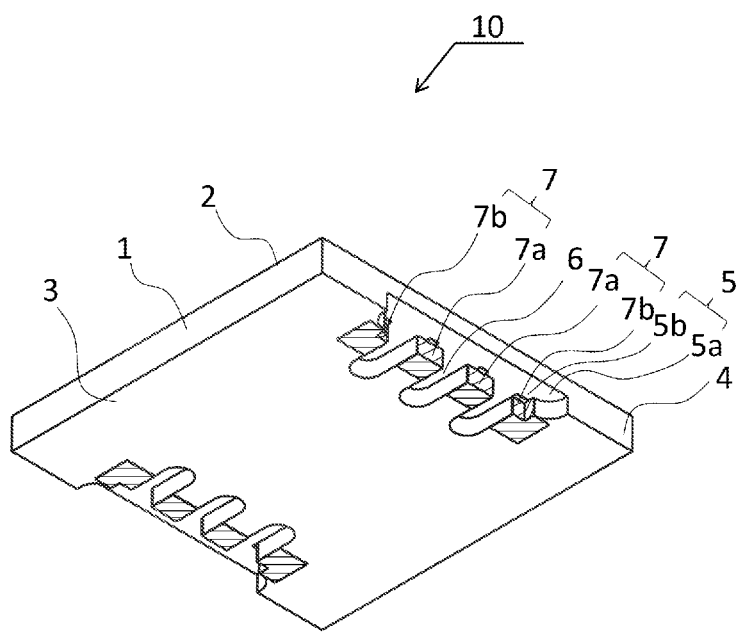
FIG. 3 is a perspective view of an electronic component housing package according to another embodiment of the invention viewed obliquely from below.
Figure 4:
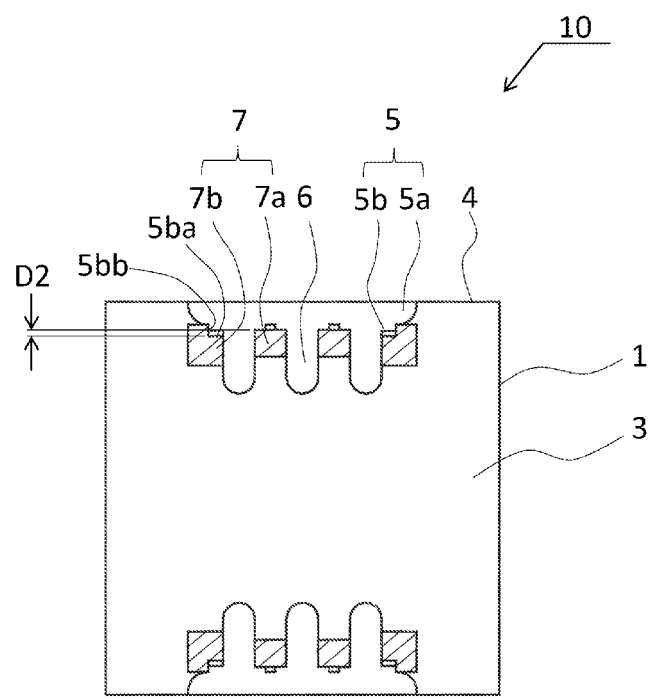
FIG. 4 is a bottom view of the electronic component housing package shown in FIG. 3.

As shown in FIGS. 3 and 4, The first cut-out portion 5 may be formed of, a first portion 5a cut out from the side of the side surface 4 and a second portion 5b cut out in the central part of the inner surface of the first portion 5a in such a manner as to further provide a level difference from the inner surface. The first portion 5a has curved surfaces on both end portions and is open to the side surface 4. Thereby, stress can be prevented from concentrating on a part on the inside wall surface of the first portion 5a. Moreover, both end surfaces of the second portion 5b are planes perpendicular to the side surface 4, and are connected to the curved surface portions of both ends of the first portion 5a. Moreover, an inner surface 5ba (the inside wall surface on the inner side) of the second portion 5b is a plane parallel to the side surface 4.

The wiring conductors 7 are disposed from the lower surface 3 to the inner surface 5ba of the second portion 5b. Thereby, the amount of joining material provided between the electronic component housing package 10 and the external wiring board can be increased. As a result, the joining reliability when the electronic component housing package 10 is joined to the external wiring board can be improved. Moreover, the second cut-out portion 6 is provided from the inner surface 5ba of the second portion 5b between the wiring conductors 7 to the lower surface 3 of the insulating base 1.

Moreover, among the wiring conductors 7, the depth of the cut-out portion of the wiring conductor 7b disposed at the outermost side from the side surface 4 may be disposed in a position deeper by D2 than the depth of the cut-out part of the central wiring conductor 7a from the side surface 4. That is, as is apparent from the example shown in FIG. 4, the distance of the outermost wiring conductor 7b from the side surface 4 may be disposed so as to be longer by D2 than the distance of the central wiring conductor 7a from the side surface 4. Thereby, the wiring conductor 7a and the wiring conductor 7b can be densely disposed by making shorter the distance between the central wiring conductor 7a and the outermost wiring conductor 7b.

From the viewpoint of reducing the capacitive coupling, a larger distance D2 is more desirable. However, if the distance D2 is too large, there is a possibility that the function as a high frequency line cannot be delivered as in the case of the above distance D1. Therefore, the distance D2 is set, for example, to 0.01 mm to 0.2 mm. Specifically, in an example of the embodiment, the distance D1 is 0.1 mm.

Further, the wiring conductor 7b located on the outermost side of the arrangement of the wiring conductors 7 is desirably formed so as to extend from the inner surface 5ba of the second portion 5b to a perpendicularly disposed end surface 5bb. The end surface 5bb is located on the boundary with the first portion 5a. The outermost wiring conductor 7b is formed on the inside wall surface of the perpendicularly bent second portion 5b, and thereby the capacitive coupling caused between the perpendicularly disposed end surface 5bb and the central wiring conductor 7a can be reduced. The wiring conductors 7a and the wiring conductors 7b on both sides thereof are capable of transmitting a high frequency signal as a coplanar line where the wiring conductors 7a function as line conductors of the high frequency signal and the wiring conductors 7b formed on the end surfaces 5bb function as grounding conductors.

Moreover, when the electronic component housing package 10 is electrically connected to the external wiring board via a joining material such as a solder, a meniscus by the joining material may be provided in the corner of the wiring conductor 7b formed between the inner surface 5ba and the end surface 5bb provided in the second portion 5b. Further, the amount of joining material provided in the second portion 5b can be increased. As a result, the joining reliability when the electronic component housing package 10 is joined to the external wiring board can be improved.

In the example of the electronic component housing package 10 shown in FIGS. 1 and 3, the wiring conductors 7 constitute a high frequency differential signal line. In this case, both wiring conductors 7b disposed on the outermost sides are grounding wiring, and through the two central wiring conductors 7a sandwiched therebetween, a high frequency differential signal is transmitted. The high frequency differential signal line is suitably used, for example, for transmitting a high frequency signal of not less than 2.5 GHz. A high frequency differential signal line further provided with a grounding wiring conductor sandwiched by the second cut-out portion 6 may be formed between the two central wiring conductors 7a through which the high frequency differential signal is transmitted.

On the upper surface 2 of the insulating base 1, an electronic component (not shown) is mounted. In the example shown in FIG. 5, an electronic component mounting area 2a is provided in the central part of the insulating base 1. In the mounting area 2a, a metalized layer is applied in order to fix the electronic component by a gold (Au)-tin (Sn) solder, a gold (Au)-germanium (Ge) solder or the like. By mounting the electronic component on the electronic component housing package 10 in this manner, an electronic device is completed. FIG. 5 shows as an example of an embodiment of the upper surface 2, and various configurations of the insulating base 1, the mounting area 2a, conductor pads 2b and the wiring conductors 7 may be taken due to the disposition of the mounting area 2a on the upper surface 2 or the like.

Around the mounting area 2a, the conductor pads 2b for the wiring conductors 7 for high frequency signals, other electric power supply conductors and grounding wiring are disposed. The conductor pads 2b are connected to electrode pads provided on the lower surface 3 via a conductor penetrating through the insulating base 1.

Then, an electronic component such as an IC or an LSI is mounted on the mounting area 2a, and the electrodes thereof are connected to the conductor pads 2b via bonding wires and a solder. Thereafter, the electronic component is sealed by a sealing member which protects the electronic component by being attached to the insulating base 1 in such a manner as to cover the mounting area 2a. The sealing member may be one which hermetically seals the electronic component. For example, it may be a resin material, a glass based material or the like, or may be a lid member made of a metallic material or the like. For the sealing member, for example, epoxy resin, silicone resin or low melting point glass is used. Moreover, when the sealing member is a metallic lid member, for example, an iron (Fe)-nickel (Ni)-cobalt (Co) alloy is used.

In the above example of the embodiment, the insulating base 1 is made of an insulating material such as resin, glass or ceramics. In the case of ceramics, a ceramic material such as alumina ceramics, aluminum nitride ceramics or mullite ceramics may be used. The insulating base 1 is preferable formed of a material which quickly releases heat generated by the electronic component mounted on the mounting area 2a. It is preferable that the thermal conductivity of the insulating base 1 be, for example, not less than 15 (W/m·K) and not more than 200 (W/m·K). Moreover, it is preferable that the heat expansion coefficient of the insulating base 1 be, for example, not less than 4 (ppm/° C.) and not more than 8 (ppm/° C.).

In the case of a ceramic insulating base 1, it is made by punching a flat ceramic green sheet using a die, laminating these sheets and sintering them. For example, for the insulating base 1 shown in FIGS. 1, 2, 3, 4 and 5, a ceramic green sheet which is rectangular and to be used as the upper half of the insulating base 1 and a ceramic green sheet which is rectangular as well and to be used as the lower half thereof are made and laminated. The ceramic green sheet to be used as the lower half is made by punching its side surface into a shape of at least one of the first cut-out portion 5 and the second cut-out portion 6.

Then, on the metalized layer formed parts of the surfaces of these ceramic green sheets, a metallic paste formed by adding and mixing an organic binder and a solvent into a metallic powder of, for example, tungsten, molybdenum or manganese is applied in a predetermined pattern by screen printing or the like. Moreover, the metallic pastes on the top and the bottom are connected together via a through conductor. Lastly, these ceramic green sheets of the upper half and the lower half are laminated together and sintered in a firing furnace to obtain the insulating base 1.

It is preferable that a nickel plating layer and a gold plating layer be successively deposited by a plating forming method onto the exposed surfaces of the metalized layers such as the wiring conductors 7 and the mounting area 2a. The nickel plating layer is plated, for example, in a thickness of 0.5 μm to 10 μm, and the gold plating layer is plated, for example, in a thickness of 0.1 μm to 5 μm. These metallic plating layers prevent the metalized layers such as the wiring conductors 7 from being oxidatively corroded. Moreover, the electrical connection between the wiring conductors 7 around the mounting area 2a and the electrodes of the electronic component can be made excellent.

Since the wiring conductors 7 are provided on the inside wall surface of the first cut-out portion 5, the possibility is low that the wiring conductors 7 collide against the external wiring board and other surrounding objects and are damaged. Moreover, since the wiring conductors 7 are provided inside the first cut-out portion 5, the packages 10 can be disposed closely to each other on the external wiring board. For the external wiring board, for example, a resin printed circuit board or a ceramic circuit board is used.

Moreover, an electronic component such as a capacitor can be closely mounted around the electronic component housing package 10 on the external wiring board, so that the external wiring board can be reduced in size. Alternatively, the degree of freedom in design of the wiring pattern of the external board can be improved.

The invention is not limited to the above embodiments, and various modifications, improvements and the like are possible without departing from the scope of the invention.

REFERENCE SIGNS LIST

1: Insulating base
2: Upper surface
2a: Mounting area
2b: Conductor pad
3: Lower surface
4: Side surface
5: First cut-out portion
5a: First portion
5b: Second portion
6: Second cut-out portion
7: Wiring conductor
7a: Central wiring conductor
7b: Outermost wiring conductor
10: Electronic component housing package

The invention claimed is:

1. An electronic component housing package, comprising:
an insulating base comprising an upper surface including an electronic component mounting area, the insulating base comprising a first cut-out portion which is formed by cutting into a lower part of a side surface of the insulating base and cutting out from the lower part of the side surface to a lower surface of the insulating base and extends from the lower part of the side surface to the lower surface;
a plurality of wiring conductors which are led from the lower surface of the insulating base and come to the upper surface of the insulating base through the insulating base via an inside wall surface of the first cut-out portion; and
a second cut-out portion which is provided between the plurality of wiring conductors and extends from the inside wall surface of the first cut-out portion to the lower surface of the insulating base,
wherein the first cut-out portion comprises a first portion which is cut out from the side surface of the insulating base and a second portion which is formed by further cutting out an inner surface central part of an inside wall of the first portion, the plurality of wiring conductors are disposed on an inside wall surface of the second portion, an outermost wiring conductor thereof is disposed from an inner surface of the second portion to a boundary between the first portion and the second portion, and the inner surface of the second portion is disposed in a deeper position in a depth direction, in which the second portion is cut out, than a central wiring conductor of the plurality of wiring conductors.

2. The electronic component housing package according to claim 1, wherein positions of the plurality of wiring conductors disposed on the inside wall surface of the first cut-out portion are on different faces in a cut-out depth direction of the first cut-out portion due to different cut-out depths of the first cut-out portion from the side surface of the insulating base.

3. The electronic component housing package according to claim 1, wherein the plurality of wiring conductors constitute a high frequency differential signal line, and a wiring conductor of the plurality of wiring conductors which is disposed on an outermost side is a grounding conductor.

4. An electronic device, comprising:
the electronic component housing package according to claim 1; and
an electronic component which is mounted on the electronic component mounting area, the electronic component being electrically connected to the plurality of wiring conductors.

* * * * *